United States Patent
Hama et al.

(10) Patent No.: US 8,569,100 B2
(45) Date of Patent: Oct. 29, 2013

(54) SOLAR CELL AND MANUFACTURING METHOD THEREOF

(75) Inventors: Atsuro Hama, Tokyo (JP); Hiroaki Morikawa, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 149 days.

(21) Appl. No.: 13/001,107

(22) PCT Filed: Jun. 26, 2008

(86) PCT No.: PCT/JP2008/061665
§ 371 (c)(1),
(2), (4) Date: Feb. 25, 2011

(87) PCT Pub. No.: WO2009/157079
PCT Pub. Date: Dec. 30, 2009

(65) Prior Publication Data
US 2011/0143486 A1    Jun. 16, 2011

(51) Int. Cl.
*H01L 21/00*    (2006.01)
(52) U.S. Cl.
USPC .............................. 438/72; 438/48; 136/243
(58) Field of Classification Search
USPC ........ 438/48, 57, 69, 71, 72, 98; 257/E33.06; 136/243, 244, 261
See application file for complete search history.

(56) References Cited

U.S. PATENT DOCUMENTS

| | | | |
|---|---|---|---|
| RE37,512 E * | 1/2002 | Szlufcik et al. | ................. 438/57 |
| 2004/0112426 A1 | 6/2004 | Hagino | |
| 2005/0252544 A1 * | 11/2005 | Rohatgi et al. | ................. 136/262 |
| 2008/0196757 A1 * | 8/2008 | Yoshimine | ..................... 136/244 |
| 2009/0286349 A1 * | 11/2009 | Rohatgi et al. | .................. 438/98 |

FOREIGN PATENT DOCUMENTS

| | | |
|---|---|---|
| JP | 05-326990 A | 12/1993 |
| JP | 2002-076399 A | 3/2002 |
| JP | 2004-193350 A | 7/2004 |
| JP | 2007-096040 A | 4/2007 |
| JP | 2007-96040 A1 | 4/2007 |
| JP | 2007-299844 A | 11/2007 |
| WO | WO 2006-129444 A | 12/2006 |
| WO | WO 2006/129444 A1 | 12/2006 |

OTHER PUBLICATIONS

Andrew W. Blakers, et al., Appl. Phys. Lett 55 (13), Sep. 25, 1989, pp. 1363-1365.
International Search Report (PCT/ISA/210) issued on Jul. 29, 2008, by Japanese Patent Office as the International Searching Authority for International Application No. PCT/JP2008/061665.
Written Opinion (PCT/ISA/237) issued on Jul. 29, 2008, by Japanese Patent Office as the International Searching Authority for International Application No. PCT/JP2008/061665.

* cited by examiner

*Primary Examiner* — Leonard Chang
(74) *Attorney, Agent, or Firm* — Buchanan Ingersoll & Rooney PC

(57) ABSTRACT

Forming an impurity diffusion layer of the second conductivity type and an antireflective film on one surface side of a semiconductor substrate of the first conductivity type; applying the first electrode material onto the antireflective film; forming a passivation film on the other surface side of the semiconductor substrate; forming openings in the passivation film to reach the other surface side; applying a second electrode material containing impurity elements of the first conductive type to fill the openings and not to be in contact with the second electrode material of adjacent openings; applying a third electrode material onto the passivation film to be in contact with the entire second electrode material; forming at a time, by heating the semiconductor substrate at a predetermined temperature after applying the first electrode material and the third electrode material, the first electrodes, a high-concentration region, and the second electrodes and third electrode.

6 Claims, 7 Drawing Sheets

SOLAR CELL AND MANUFACTURING METHOD THEREOF

TECHNICAL FIELD

The present invention relates to a solar cell and a manufacturing method thereof, and especially to a solar cell that has less warpage of the solar battery and exhibits excellent characteristics even when the substrate is thinned, and a solar cell manufacturing method with which such a solar cell can be efficiently produced.

BACKGROUND ART

Aluminum paste that has been conventionally adopted for aluminum back electrodes of a photovoltaic device such as a solar battery has an advantage that the electrodes can be readily formed by screen printing or the like. Furthermore, the aluminum paste has another advantage that a so-called back surface field (BSF) layer, which improves the efficiency of collecting majority carriers, can be readily formed by diffusing aluminum into the silicon substrate and thereby readily forming by heat treatment a p+ layer in which p-type impurities are diffused in high concentration, and generating a barrier electric field inside the photovoltaic device against minority carriers.

The solar battery manufacturing process that is currently in wide use is briefly explained below.
(101) First, a p-type silicon substrate from which a damaged layer formed at the time of slicing is prepared, and a fine uneven structure called texture is created on the surface of the p-type silicon substrate by etching the p-type silicon substrate with an alkaline solution.
(102) After diffusing phosphorus oxychloride ($POCl_3$), phosphoric acid or the like into the light receiving surface of the p-type silicon substrate and thereby forming an n-type impurity diffusion layer, a film predominantly containing glass is removed from the surface, and the n-type impurity diffusion layer is also removed from the end surfaces and the back surface.
(103) An antireflective film is formed on the light receiving surface of the p-type silicon substrate on which the n-type impurity diffusion layer is formed.
(104) A paste containing silver and glass is applied partially on the opposite surface (back surface) of the p-type silicon substrate with respect to the light receiving surface, in the shape of a collective back electrode.
(105) A paste containing aluminum and glass for formation of the aluminum back electrodes is applied onto the area of the back surface of the p-type silicon substrate where no collective back electrode is arranged.
(106) The paste containing silver and glass is applied in the shape of light receiving surface electrodes onto the light receiving surface of the p-type silicon substrate.
(107) The collective back electrode, the aluminum back electrodes, and the light receiving surface electrodes are obtained by firing at a certain temperature in the air, and aluminum is diffused from the aluminum back electrodes into the silicon substrate to form a BSF layer. At the same time, the so-called fire through process occurs, by which silver from the light receiving surface electrodes penetrates through the antireflective film and establishes an electrical connection with the n-type impurity diffusion layer, and thereby a solar cell is completed.

The above process allows all the electrodes to be formed in a single firing process, and thus this process is most widely used at present.

In the meantime, concerns are rising that silicon materials could become in short because of prospective rapid growth of silicon solar batteries. As a measure against this, the thickness of the silicon substrate may be reduced from the conventional order of 200 micrometers to a smaller thickness. Then, the silicon materials can be efficiently used, and the manufacturing cost of solar batteries can be reduced, while the production volume can be increased.

However, if the thickness of the silicon substrate is to be reduced, during the firing operation for electrode formation in the above process, the difference between the linear expansion coefficients of aluminum and silicon incurs warpage at the time of cooling in a subsequent stage in the firing operation. This significantly increases the breakage rate of solar cells during the manufacturing process.

The aforementioned warpage that occurs in the solar cell could be reduced by thinning the applied aluminum paste. However, if the thickness of the aluminum paste is too small, the thickness of the BSF layer that is formed by firing also becomes small, which prevents the solar cell from maintaining its characteristics.

In addition, as the thickness of the silicon substrate is reduced, multiple reflection should be caused inside the silicon substrate and the optical path should be extended in order to fully use long-wavelength light that has a small absorption coefficient for electricity generation. However, because the aluminum back electrodes formed of aluminum has a low reflectance with respect to the long-wavelength light, the utilization efficiency decreases and the amount of current generation is lessened.

For this reason, a method has been conceived with which, in place of the thinned BSF layer that is formed by heating the aluminum paste, a back-surface passivation film that inactivates defects on the back surface of the silicon substrate is incorporated so that the excellent characteristics of the solar cell can be maintained while warpage of the silicon substrate can be avoided. More specifically, a method of forming a back-surface passivation film such as a silicon nitride or silicon oxide film on the back surface of the silicon substrate, forming contact holes in this back-surface passivation film, and electrically connecting the aluminum back electrodes to the silicon substrate has been disclosed (see, for example, Patent Document 1).

However, the method according to Patent Document 1 requires a step of preparing openings in the back-surface passivation film with a laser to form contact holes and a step of aligning the aluminum back electrodes precisely to the laser-processed openings. In addition, because the firing operation has to be conducted several times, the number of processing steps significantly increases, in comparison with the conventional method that has been in wide use. The typical method of manufacturing a solar battery by preparing openings in the back-surface passivation film with a laser and electrically connecting the silicon substrate to the back electrodes is explained below. The steps (111) to (113) for forming an n-type impurity diffusion layer and an antireflective film on the light receiving surface of the p-type silicon substrate are the same as (101) to (103) of the conventional method.
(111) First, a p-type silicon substrate from which a damaged layer formed at the time of slicing is removed is prepared, and the p-type silicon substrate is etched with an alkaline solution to form a fine uneven structure called texture on the surface of the p-type silicon substrate.
(112) After phosphorus oxychloride ($POCl_3$), phosphoric acid, or the like is diffused in the light receiving surface of the p-type silicon substrate to form an n-type impurity diffusion layer, a film predominantly containing glass is removed from the surface, and the n-type impurity diffusion layer is also removed from the edge surfaces and the back surface.

(113) An antireflective film is formed on the light receiving surface of the p-type silicon substrate on which the n-type impurity diffusion layer is formed.

(114) A back-surface passivation film is formed on the back surface of the p-type silicon substrate by use of silicon nitride or a silicon oxide film.

(115) Contact holes are formed in the back-surface passivation film with a laser.

(116) A paste containing aluminum, glass, and the like is applied on the contact holes formed in the back-surface passivation film to form aluminum back electrodes.

(117) firing is conducted in the air at a certain temperature to form aluminum back electrodes and also a BSF layer. The method of setting the level of oxygen lower than or equal to 100 ppm at this time and thereby reducing the electrical resistance to the collective back electrode that is to be formed at the next step is disclosed in Patent Document 1.

(118) A paste containing silver, glass, and the like is applied onto the aluminum back electrodes to form a collective back electrode. Moreover, the paste containing silver, glass, and the like is applied onto the light receiving surface of the p-type silicon substrate to form light receiving surface electrodes.

(119) firing is conducted in the air at a certain temperature to form the collective back electrode and the light receiving surface electrodes, the silver in the light receiving surface electrodes penetrates through the antireflective film to establish an electrical connection with the n-type impurity diffusion layer, and thereby the solar cell is completed.

With the above method, an efficient solar cell with small warpage can be produced by forming the back-surface passivation film and the BSF layer. However, the number of steps is significantly increased, in comparison with the aforementioned conventional method.

Furthermore, Non-patent Document 1 discloses, as a passivated emitter and rear cell (PERC) structure, a solar battery produced by a method, with which a back-surface passivation film is formed by use of the silicon oxide film and openings are created in this back-surface passivation film. As described above, when a silicon oxide film is adopted for the back-surface passivation film, steps of preparing a resist pattern on the back-surface passivation film by photolithography and forming openings in the silicon oxide film with hydrofluoric acid are required. With this method also, the number of steps is significantly increased, and thus volume production of solar cells cannot be efficiently performed.

Moreover, a method of forming a dot pattern of an aluminum paste on the back-surface passivation film by screen printing or the like and electrically connecting it with the silicon substrate by the so-called fire-through process has been disclosed, for example, in Patent Document 1. According to the embodiments of Patent Document 1, after a back-surface passivation film is formed, a dot pattern of a paste containing aluminum, glass, and the like is formed and fired on the back-surface passivation film, and thereby a BSF layer is formed. Then, a collective back electrode and light receiving surface electrodes are formed of the paste containing silver, glass, and the like and subjected to the firing to complete the solar cell.

Patent Document 1: Japanese Patent Application Laid-open No. 2007-299844

Non-patent Document 1: Appl. Phys. Lett. vol. 55 (1989), p. 1363-1365

DISCLOSURE OF INVENTION

Problem to be Solved by the Invention

In the method according to Patent Document 1, two firing steps, an firing step for formation of point contacts and another firing step for formation of collective and light receiving surface electrodes, have to be performed. Thus, there is a problem in that the process becomes complicated and an amount of power energy consumption increases, which increases manufacturing costs.

The present invention has been made in view of the above, and an object is to achieve a high-quality solar cell that has no warpage and exhibits excellent battery cell characteristics even when the semiconductor substrate is thinned, and a manufacturing method thereof.

Means for Solving Problem

A solar cell manufacturing method according to an aspect of the present invention includes: a first step of forming an impurity diffusion layer, in which impurity elements of a second conductivity type are diffused, on one surface side of a semiconductor substrate of a first conductivity type; a second step of forming an antireflective film on the impurity diffusion layer; a third step of applying a first electrode material containing glass onto the antireflective film; a fourth step of forming a passivation film on an other surface side of the semiconductor substrate; a fifth step of forming, in at least part of the passivation film, a plurality of openings that reach the other surface side of the semiconductor substrate; a sixth step of applying a second electrode material containing impurity elements of the first conductive type so as to fill the openings and not to be in contact with the second electrode material of adjacent openings; a seventh step of applying a third electrode material onto the passivation film so as to be in contact with the entire second electrode material that is applied; and an eighth step for simultaneously forming, by heating the semiconductor substrate at a predetermined temperature after applying the first electrode material and the third electrode material, first electrodes that penetrate the antireflective film and are electrically connected to the impurity diffusion layer, a high-concentration region in the other surface side of the semiconductor substrate in which impurities of the first conductive type are diffused in higher concentration than in another region of the semiconductor substrate, and second electrodes and a third electrode that are electrically connected to the high-concentration region.

Effect of the Invention

With the method of manufacturing a solar cell according to the present invention, the electrodes and a high-concentration region in which impurities of the first conductive type are diffused in high concentration can be formed at a time by one firing process. Hence, the manufacturing process can be simplified, the amount of power energy consumption can be reduced, and thereby the manufacturing costs can be reduced. Thus, an excellent solar cell with no warpage and with excellent battery cell characteristics can be produced at low costs.

BRIEF DESCRIPTION OF DRAWINGS

FIG. 2-1 is a section view explaining a method of manufacturing the solar cell according to the first embodiment.

FIG. 2-2 is a section view explaining the method of manufacturing the solar cell according to the first embodiment.

FIG. 2-3 is a section view explaining the method of manufacturing the solar cell according to the first embodiment.

FIG. 2-4 is a section view explaining the method of manufacturing the solar cell according to the first embodiment.

FIG. 2-5 is a section view explaining the method of manufacturing the solar cell according to the first embodiment.

FIG. 2-6 is a section view explaining the method of manufacturing the solar cell according to the first embodiment.

FIG. 2-7 is a section view explaining the method of manufacturing the solar cell according to the first embodiment.

FIG. 2-8 is a section view explaining the method of manufacturing the solar cell according to the first embodiment.

FIG. 2-9 is a section view explaining the method of manufacturing the solar cell according to the first embodiment.

FIG. 3-1 is a plan view showing an exemplar formation pattern of aluminum back electrodes in the solar cell according to the first embodiment.

FIG. 3-2 is a plan view showing an example formation pattern of the collective back electrode in the solar cell according to the first embodiment.

FIG. 4 is a section view explaining a structure of a solar cell according to a second embodiment.

FIG. 5-1 is a section view explaining a method of manufacturing the solar cell according to the second embodiment.

FIG. 5-2 is a section view explaining the method of manufacturing the solar cell according to the second embodiment.

FIG. 5-3 is a section view explaining the method of manufacturing the solar cell according to the second embodiment.

FIG. 5-4 is a section view explaining the method of manufacturing the solar cell according to the second embodiment.

FIG. 5-5 is a section view explaining the method of manufacturing the solar cell according to the second embodiment.

FIG. 5-6 is a section view explaining the method of manufacturing the solar cell according to the second embodiment.

FIG. 5-7 is a section view explaining the method of manufacturing the solar cell according to the second embodiment.

FIG. 5-8 is a section view explaining the method of manufacturing the solar cell according to the second embodiment.

EXPLANATIONS OF LETTERS OR NUMERALS

Figure 1:
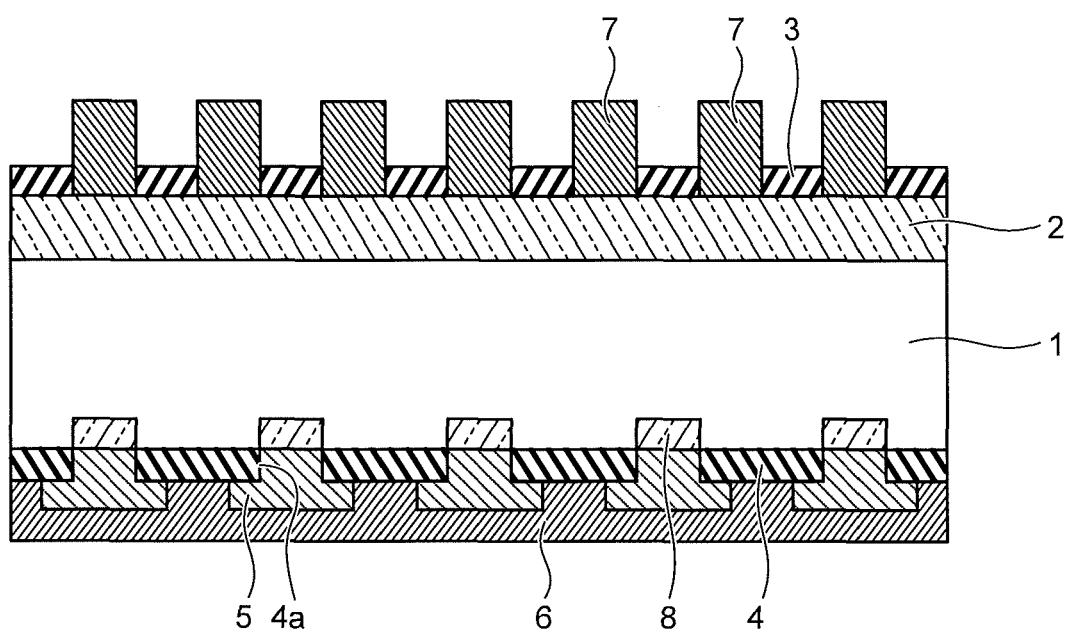
FIG. 1 is a section view explaining a structure of a solar cell according to a first embodiment of the present invention.

1 Semiconductor substrate
2 Impurity diffusion layer
3 Antireflective film
4 Back-surface passivation film
4a Contact hole
5 Aluminum back electrode
5a Aluminum back electrode material paste
6 Collective back electrode
6a Collective back electrode material paste
7 Light receiving surface electrode
7a Light receiving surface electrode material paste
8 BSF layer
11 Soldering area

BEST MODE(S) FOR CARRYING OUT THE INVENTION

The embodiments of the solar cell and the manufacturing method thereof according to the present invention are explained in detail below with reference to the drawings. However, the present invention should not be limited to the following description, and may be suitably modified without departing from the scope of the invention. In addition, the drawings discussed below may not be accurately to scale, for convenience of explanation. This holds for the relationship between the drawings.

First Embodiment

FIG. 1 is a section view explaining a structure of a solar cell according to a first embodiment of the present invention. In the solar cell according to the present embodiment, an impurity diffusion layer (n-type impurity diffusion layer) 2 is formed by phosphorus diffusion on the light receiving surface of a semiconductor substrate 1 of p-type silicon, and an antireflective film 3 is formed of a silicon nitride film.

For the semiconductor substrate 1, a p-type single-crystalline or polycrystalline silicon substrate may be used. The substrate, however, is not limited thereto, and an n-type silicon substrate may be adopted. Furthermore, a silicon oxide film may be adopted for the antireflective film 3. In addition, fine unevenness is formed as a texture structure in the surface of the semiconductor substrate 1 of the solar cell on the light receiving surface side. The fine unevenness is configured to increase the area for absorbing external light on the light receiving surface, suppress the reflectance on the light receiving surface, and trap the light therein.

Moreover, light receiving surface electrodes 7, which are formed of an electrode material containing silver and glass, are arranged on the light receiving surface of the semiconductor substrate 1 in such a manner as to penetrate the antireflective film 3 and establish electrical connections with the impurity diffusion layer (n-type impurity diffusion layer) 2. As the light receiving surface electrodes 7, plural long and thin grid electrodes are aligned in the in-plane direction of the light receiving surface of the semiconductor substrate 1, and a bus electrode that has electrical continuity to these grid electrodes is arranged substantially orthogonal to the grid electrodes in the in-plane direction of the semiconductor substrate 1 of the light receiving surface. Each of the electrodes is electrically connected to the impurity diffusion layer 2 at its bottom portion. The forms of the grid electrodes and the bus electrode are not directly related to the present invention, and thus detailed description thereof is omitted from FIG. 1.

On the other hand, a back-surface passivation film 4 formed of a silicon nitride film is arranged entirely on the back surface of the semiconductor substrate 1 (the surface opposite to the light receiving surface). A silicon oxide film may also be adopted for the back-surface passivation film 4. Contact holes 4a are provided in a dot pattern in the back-surface passivation film 4 to reach the back surface of the semiconductor substrate 1. Then, aluminum back electrodes 5 formed of an electrode material containing aluminum, glass, and the like are arranged so as to fill the contact holes 4a and have an outer shape greater than the diameter of a contact hole 4a in the in-plane direction of the back-surface passivation film 4. Furthermore, a collective back electrode 6 is arranged on the back surface of the semiconductor substrate 1 to cover the aluminum back electrodes 5 so as to establish electrical connections with all the aluminum back electrodes 5. The aluminum back electrodes serve as point contacts between the semiconductor substrate 1 (p-type silicon substrate) and the collective back electrode 6.

Moreover, a BSF layer 8 serving as p+ regions, in which aluminum is diffused in high concentration from the aluminum back electrode 5 into the back side of the semiconductor substrate 1, is formed around areas on the back surface of the semiconductor substrate 1 that are in contact with the aluminum back electrodes 5.

With the above structure, the aforementioned solar cell according to the first embodiment is configured in such a manner that formation of the BSF layer 8 and formation of the collective back electrode 6 required for assembly can be simultaneously performed at a single firing step. Thus, an inexpensive solar cell, the manufacturing cost of which is lowered by simplifying the production process and reducing the amount of power energy consumption, has been achieved.

Next, a method of manufacturing the above solar cell according to the present embodiment is explained with reference to FIGS. 2-1 to 2-9. FIGS. 2-1 to 2-9 are section views explaining a method of manufacturing a solar cell according to the first embodiment.

Figures 1, 2:
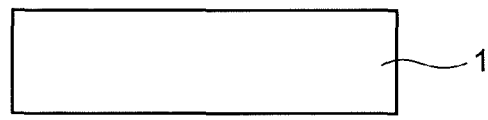
Figure 2:
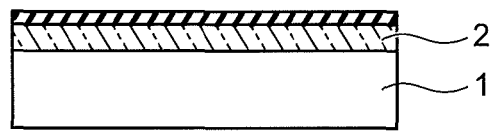

First, a p-type silicon substrate is prepared as the semiconductor substrate 1 (FIG. 2-1). Then, the p-type silicon substrate is subjected to etching for removing the damaged layer that is formed at the time of slicing, by use of an alkaline solution of a temperature approximately 80° C. to 100° C. such as sodium hydroxide and potassium hydroxide, or by use of an acid solution approximately at ambient temperature such as a mixed solution of hydrofluoric acid and nitric acid. Thereafter, the p-type silicon substrate is subjected to etching by use of an alkaline solution such as sodium hydroxide at a 1 wt % to several wt % concentration, and thereby fine unevenness is formed as a texture structure on the light receiving surface of the semiconductor substrate 1. By forming such a texture structure on the light receiving surface of the semiconductor substrate 1, multiple light reflection occurs on the surface of the solar cell so that the reflectance can be effectively lowered and the conversion efficiency can be improved.

Next, a PN junction is established by diffusing phosphorus oxychloride ($POCl_3$), phosphoric acid, and the like by thermal diffusion into the p-type silicon substrate having the texture structure on its surface and forming the impurity diffusion layer (n-type impurity diffusion layer) 2 (FIG. 2-2). Here, because a film mainly containing glass is formed on the surface of the impurity diffusion layer (n-type impurity diffusion layer) 2 immediately after the formation, the film is removed by use of hydrofluoric acid or the like. Further, after the light receiving surface side is protected with a resist, an acid-resistant resin, or the like, the p-type silicon substrate is soaked in a fluoro-nitric acid solution to remove the impurity diffusion layer (n-type impurity diffusion layer) 2 from the edge surfaces and back surface of the p-type silicon substrate.

Figures 2, 3:
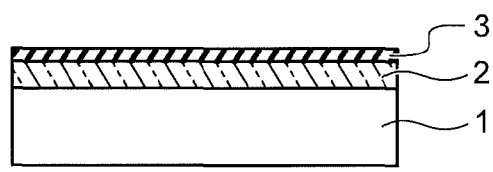

Next, a silicon nitride film is formed as the antireflective film 3 on the light receiving surface of the p-type silicon substrate on which the impurity diffusion layer (n-type impurity diffusion layer) 2 is formed so that the photoelectric conversion efficiency can be improved (FIG. 2-3). When forming the antireflective film 3, plasma chemical vapor deposition may be adopted, and a mixed gas of silane and ammonia is used to form a silicon nitride film as the antireflective film 3. A silicon oxide film may be formed as the antireflective film 3.

Figures 2, 3, 4:
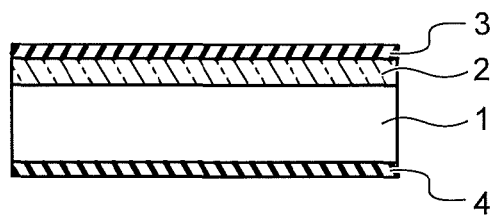

Next, the back-surface passivation film 4 is formed of a silicon nitride film on the back surface of the p-type silicon substrate (FIG. 2-4). The Plasma-enhanced Chemical Vapor Deposition may be adopted for the formation of the back-surface passivation film 4. A silicon oxide film may be formed as the back-surface passivation film 4. Thereafter, contact holes (openings) 4a are formed in a dot pattern at certain intervals partially or entirely in the back-surface passivation film 4 by use of laser light (FIG. 2-5).

Next, an aluminum back electrode material paste 5a, which is an electrode material of the aluminum back electrode 5, containing aluminum, glass, and the like is applied by screen printing. The aluminum back electrode material paste 5a is applied so as to fill the contact hole 4a, and also to cover a region slightly larger than the diameter of the contact hole 4a in the in-plane direction of the back-surface passivation film 4 and not to touch the aluminum back electrode material paste 5a filled in the adjacent contact holes 4a (FIG. 2-6). The shape, size, and the like of the paste 5a that is applied can be modified in accordance with conditions such as the aluminum diffusion concentration in the BSF layer 8.

Next, a collective back electrode material paste 6a containing silver, glass, and the like that is an electrode material of the collective back electrode 6 is selectively applied by screen printing, by coating the aluminum back electrode material paste 5a in such a manner as to be in contact with the entire aluminum back electrode material paste 5a that is applied (FIG. 2-7). Because the area in which the aluminum back electrodes 5 and the collective back electrode 6 overlap each other is alloyed after the later-described firing operation and becomes difficult to be soldered, the aluminum back electrode material paste 5a is not applied to soldering area 11 of the collective back electrode 6 in which soldering is conducted.

FIG. 3-1 is a plan view showing an exemplar formation pattern of the aluminum back electrodes 5 (the application pattern of the aluminum back electrode material paste 5a), and FIG. 3-2 is a plan view showing an exemplar formation pattern of the collective back electrode 6 (the application pattern of the collective back electrode material paste 6a). According to the present embodiment, as indicated in FIGS. 3-1 and 3-2, the aluminum back electrodes 5 are arranged in a dot pattern evenly on the entire surface of the back-surface passivation film 4, but no aluminum back electrode 5 is formed in the areas corresponding to the soldering areas 11 of the collective back electrode 6 (two wide middle portions in FIG. 3-2).

Next, a light receiving surface electrode material paste 7a, which is an electrode material of the light receiving surface electrodes 7, containing silver, glass, and the like is selectively applied by screen printing onto the antireflective film 3 on the light receiving surface of the p-type silicon substrate in the shape of the light receiving surface electrodes 7 (FIG. 2-8). Thereafter, firing is conducted in the air at the temperature of 750° C. to 900° C., for example. In this manner, the light receiving surface electrodes 7, the aluminum back electrodes 5, and the collective back electrode 6 are formed. Also, the BSF layer 8, which is a p+ region in which aluminum from the aluminum back electrodes 5 is diffused in high concentration, is formed on the back surface of the p-type silicon substrate around a region which is in contact with the aluminum back electrodes 5, and an electrical connection is established between the BSF layer 8 and the collective back electrode 6. Furthermore, silver in the light receiving surface electrodes 7 penetrates the antireflective film 3 so that an electrical connection is established between the impurity diffusion layer (n-type impurity diffusion layer) 2 and the light receiving surface electrodes 7 (FIG. 2-9).

In this manner, the solar cell according to the first embodiment indicated in FIG. 1 is produced. The order of applying the electrode material pastes may be reversed for the light receiving surface and the back surface.

As described above, with the method of manufacturing the solar cell according to the first embodiment, the process of firing for formation of the BSF layer 8 by use of the aluminum back electrodes 5, which serve as point contacts, and the process of firing for formation of the collective back electrode 6, which is required for assembly, can be simultaneously executed in a single firing process. For this reason, even when the p-type silicon substrate is designed to be thinned, the manufacturing process can be simplified and the amount of power energy consumption can be reduced so that the production costs can be cut down. Furthermore, a high-quality solar cell without warpage and with excellent battery cell characteristics can be produced at low cost.

In addition, with the method of manufacturing the solar cell according to the first embodiment, the aluminum back electrodes 5 are arranged in the form of points evenly on the entire back surface of the p-type silicon substrate, as illustrated in FIG. 3-1. With such a structure, due to the effects of the back-surface passivation film 4 and the BSF layer 8, warpage is prevented from occurring in the solar cell and excellent battery cell characteristics can be obtained, even when the aluminum back electrodes 5 are thinned to reduce the thickness of the p-type silicon substrate. Hence, a high-quality solar cell can be produced at low cost.

In addition, when manufacturing a solar cell module, an area for soldering the lead frame is required because the collective back electrode 6 formed of the paste containing silver, glass, and the like, is connected in series to the light receiving surface of an adjacent solar cell. With the method of manufacturing the solar cell according to the first embodiment, no aluminum back electrode 5 is arranged in the soldering areas 11 of the collective back electrode 6 in which soldering of the lead frame is performed (the two wide middle portions in FIG. 3-2). With such a structure, soldering of the lead frame would not be hindered by the alloy of aluminum and silver that is produced by firing, and favorable soldering of the lead frame can be ensured.

Second Embodiment

In the second embodiment, another solar cell and manufacturing method thereof in the present invention are explained in detail. FIG. 4 is a section view explaining a structure of the solar cell according to the second embodiment. Portions of the structure that are the same as the first embodiment are given the same numerals as in FIG. 1, and thereby the detailed explanation is omitted.

In the solar cell according to the present embodiment, the impurity diffusion layer (n-type impurity diffusion layer) 2 is formed by phosphorus diffusion on the light receiving surface of the p-type silicon semiconductor substrate 1, and also the antireflective film 3 of a silicon nitride film is formed thereon. Fine unevenness is formed as a texture structure in the light receiving surface of the semiconductor substrate 1 of the solar cell. The fine unevenness has a structure that increases the area of the light receiving surface that absorbs external light, suppresses the reflectance on the light receiving surface, and confines light.

In addition, the light receiving surface electrodes 7, which are formed of a material containing silver and glass, are arranged on the light receiving surface of the semiconductor substrate 1 so as to penetrate the antireflective film 3 and establish an electrical connection with the impurity diffusion layer (n-type impurity diffusion layer) 2. As the light receiving surface electrodes 7, multiple long, thin grid electrodes are aligned in the in-plane direction on the light receiving surface of the semiconductor substrate 1, and a bus electrode that has electrical continuity to these grid electrodes is arranged in such a manner as to be substantially orthogonal to the grid electrodes in the in-plane direction of the light receiving surface of the semiconductor substrate 1. Thus, each of the electrodes establishes an electrical connection to the impurity diffusion layer 2 at its bottom surface. The forms of the grid electrodes and the bus electrode are not directly related to the present invention, and thus detailed description thereof is omitted from FIG. 4.

On the other hand, the back-surface passivation film 4 of a silicon nitride film is arranged on the entire back surface of the semiconductor substrate 1. Furthermore, the aluminum back electrodes 5 are formed of an electrode material containing aluminum, glass, and the like and arranged on the back surface of the semiconductor substrate 1 so as to protrude from the back-surface passivation film 4 and reach the back surface of the semiconductor substrate 1 through the back-surface passivation film 4. Still further, the collective back electrode 6 is provided on the back surface of the semiconductor substrate 1, the collective back electrode 6 covering the aluminum back electrodes 5 so as to be in contact with all the aluminum back electrodes 5. The aluminum back electrodes 5 serve as point contacts between the semiconductor substrate 1 (p-type silicon substrate) and the collective back electrode 6.

Moreover, the BSF layer 8, which is a p+ region, is formed in the back surface of the semiconductor substrate 1 around the area in contact with the aluminum back electrodes 5, with aluminum diffused in high concentration from the aluminum back electrodes 5 into the back surface of the semiconductor substrate 1.

With the above structure, the above solar cell according to the second embodiment is configured to form the BSF layer 8 and the collective back electrode 6 that is required for assembly, at a time by a single firing operation. Hence, an inexpensive solar cell the production cost of which is lowered by simplifying the production process and reducing the amount of power energy consumption is achieved.

Next, a method of manufacturing the above solar cell according to the second embodiment is explained with reference to FIGS. 5-1 to 5-8. FIGS. 5-1 to 5-8 are section views explaining the method of manufacturing the above solar cell according to the second embodiment.

First, a p-type silicon substrate is prepared as the semiconductor substrate 1 (FIG. 5-1), and a damaged layer formed during the time of slicing is removed by performing etching onto the p-type silicon substrate by use of an alkaline solution approximately at 80 to 100° C. such as sodium hydroxide and potassium hydroxide, or by use of an acid solution at ambient temperature such as a mixed solution of hydrofluoric acid and nitric acid. Thereafter, the p-type silicon substrate is etched by use of an alkaline solution at 1 wt % to several wt % concentration such as sodium hydroxide so that fine unevenness is formed in the light receiving surface of the semiconductor substrate 1 as a texture structure. By creating such a texture structure on the light receiving surface of the semiconductor substrate 1, multiple light reflection is caused on the surface of the solar cell, and the reflectance can be effectively lowered and the conversion efficiency can be structured.

Figures 2, 3, 4, 5:
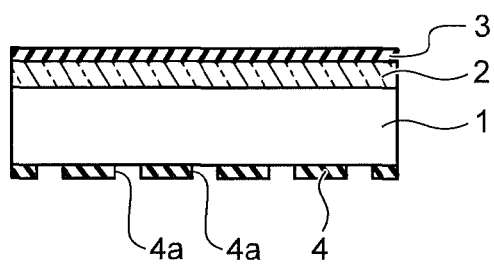

Next, phosphorus oxychloride ($POCl_3$), phosphoric acid, or the like is diffused by thermal diffusion into the p-type silicon substrate having the texture structure on its surface to form the impurity diffusion layer (n-type impurity diffusion layer) 2, and thereby a PN junction is provided (FIG. 5-2). Here, a film mainly containing glass is formed on the surface of the impurity diffusion layer (n-type impurity diffusion layer) 2 immediately after its formation, and therefore should be removed by use of hydrofluoric acid or the like. Moreover, by soaking the p-type silicon substrate in the fluoro-nitric acid solution after protecting the light receiving surface with a resist, an acid-resistant resin, or the like, the impurity diffusion layer (n-type impurity diffusion layer) 2 is removed from the end surfaces and back surface of the p-type silicon substrate.

Next, to improve the photoelectric conversion efficiency, a silicon nitride film is formed as the antireflective film 3 on the light receiving surface of the p-type silicon substrate on which the impurity diffusion layer (n-type impurity diffusion layer) 2 is arranged (FIG. 5-3). For formation of the antireflective film 3, plasma CVD may be used, and the silicon nitride film is formed as the antireflective film 3 by use of a mixed gas of silane and ammonia. Incidentally, as the antireflective film 3, a silicon oxide film may be formed.

Then, the back-surface passivation film 4 of a silicon nitride film is formed on the back surface of the p-type silicon substrate (FIG. 5-4). Plasma CVD may be used to form the back-surface passivation film 4. Incidentally, a silicon oxide film may be formed as the back-surface passivation film 4.

Next, the aluminum back electrode material paste 5a, which is the electrode material of the aluminum back electrodes 5, containing aluminum, glass, and the like is selectively applied by screen printing evenly in a dot pattern having certain intervals, on part of or the entire surface of the back-surface passivation film 4 (FIG. 5-5).

Figures 2, 3, 4, 5, 6:
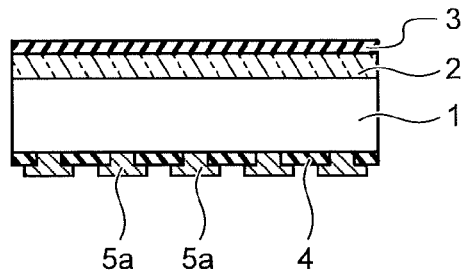

Next, the collective back electrode material paste 6a, which is the electrode material of the collective back electrode 6, containing silver, glass, and the like is selectively applied by screen printing to cover the aluminum back electrode material paste 5a so as to be in contact with all the applied aluminum back electrode material paste 5a (FIG. 5-6). Because the overlapping portion of the aluminum back electrodes 5 and the collective back electrode 6 is alloyed after the later-described firing process and becomes difficult to be soldered, the aluminum back electrode material paste 5a is not applied to the soldering area 11 of the collective back electrode 6 in which soldering is performed. According to the present embodiment, the aluminum back electrodes 5 are arranged in a dot pattern evenly on the entire surface of the back-surface passivation film 4, but no aluminum back electrode 5 is formed in the portion corresponding to the soldering area 11 of the collective back electrode 6 (see FIGS. 3-1 and 3-2).

Figures 2, 3, 4, 5, 6, 7:
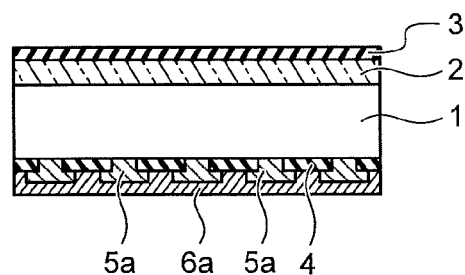
Figures 2, 3, 4, 5, 6, 7, 8:
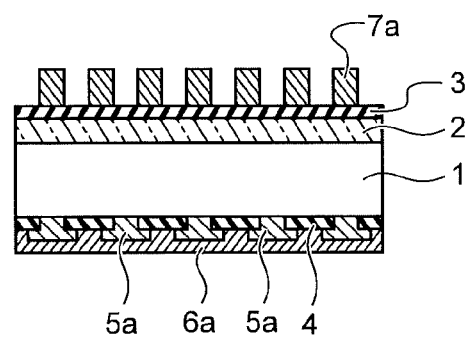
Figures 2, 3, 4, 5, 6, 7, 8, 9:
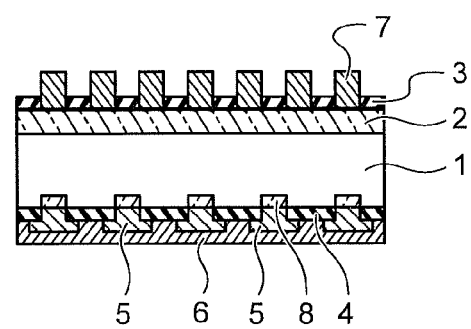
Figures 1, 3:
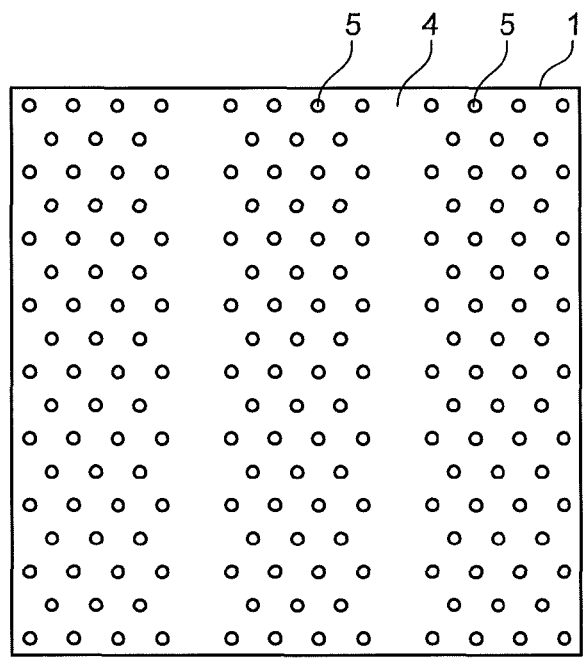
Figures 2, 3:
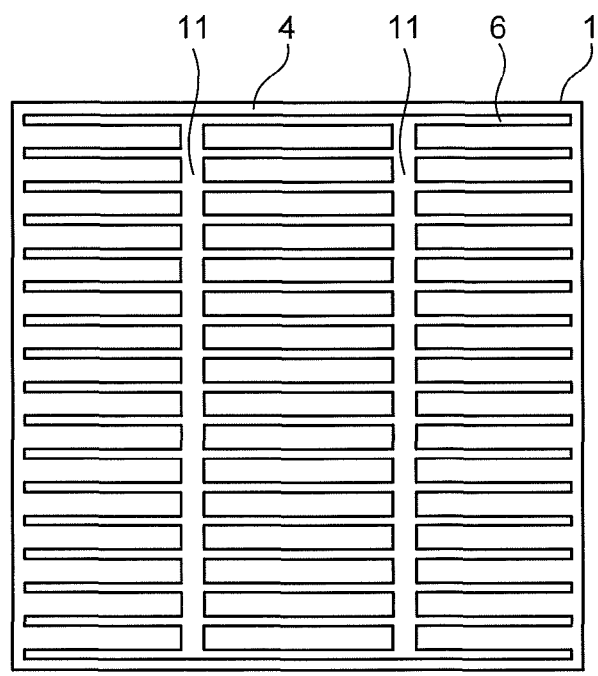
Figure 4:
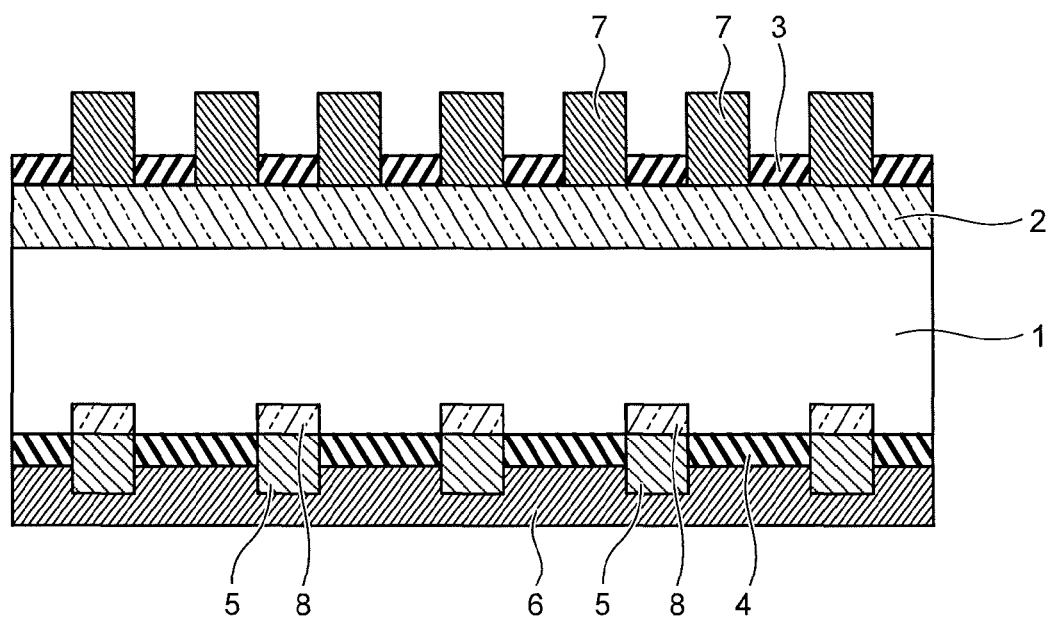
Figures 1, 5:
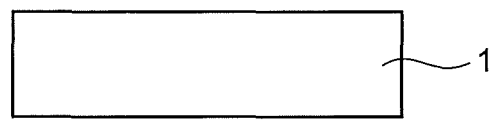
Figures 2, 5:
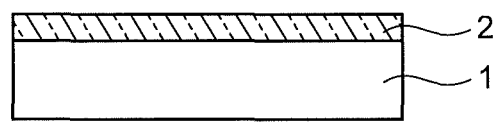
Figures 3, 5:
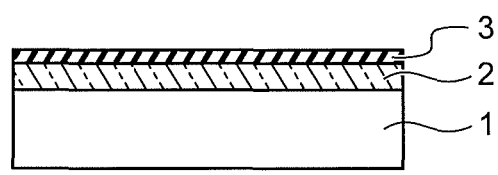
Figures 4, 5:
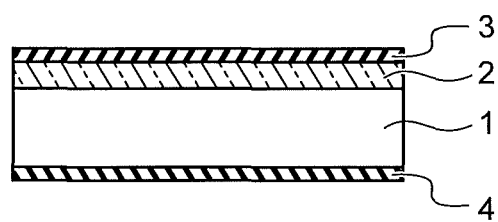
Figure 5:
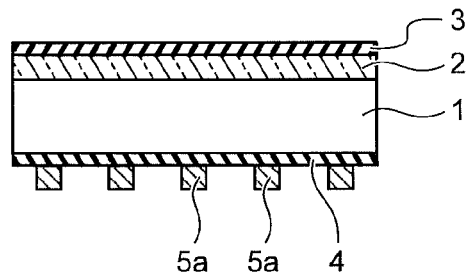
Figures 5, 6:
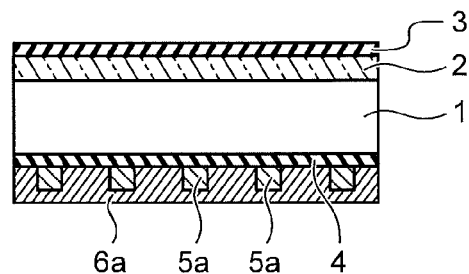
Figures 5, 6, 7:
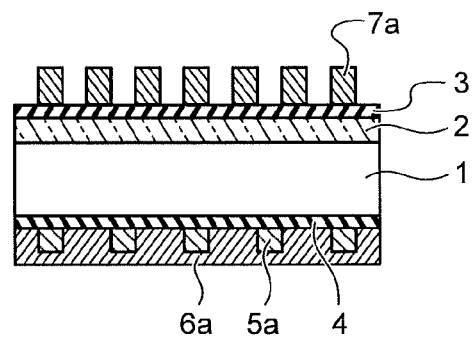
Figures 5, 6, 7, 8:
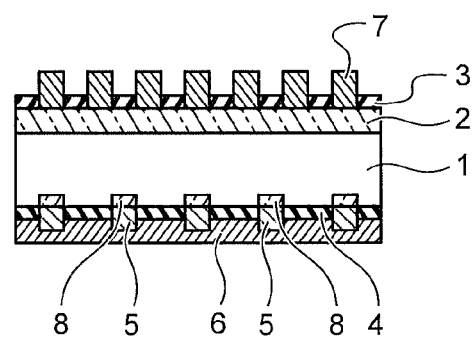

Next, the light receiving surface electrode material paste 7a, which is the electrode material of the light receiving surface electrodes 7, containing silver, glass and the like is selectively applied onto the antireflective film 3 provided on the light receiving surface of the p-type silicon substrate, in the shape of the light receiving surface electrodes 7 by screen printing (FIG. 5-7). Thereafter, firing is performed in the air, for example, at 750° C. to 900° C. As a result, the light receiving surface electrodes 7, the aluminum back electrodes 5, and the collective back electrode 6 are formed. Also, the BSF layer 8, which is a p+ region in which aluminum is diffused from the aluminum back electrodes 5 in high concentration, is formed in the area of the back surface of the p-type silicon substrate that is in contact with the aluminum back electrodes 5; and an electrical connection is established between the BSF layer 8 and the collective back electrode 6. Moreover, silver in the light receiving surface electrodes 7 penetrates the antireflective film 3, and the impurity diffusion layer (n-type impurity diffusion layer) 2 and the light receiving surface electrodes 7 are electrically connected to each other (FIG. 5-8).

As described above, the solar cell according to the second embodiment as illustrated in FIG. 4 is manufactured. The order of applying the electrode material pastes may be reversed for the light receiving surface and the back surface.

As described above, with the method of manufacturing the solar cell according to the second embodiment, the firing process for formation of the BSF layer 8 by use of the aluminum back electrodes 5 that are point contacts and the firing process for formation of the collective back electrode 6 required for assembly are performed at a time by a single firing process. As a result, even when the p-type silicon substrate is designed to be thinned, the manufacturing process can be simplified, and the amount of power energy consumption can be cut down so that the production cost can be reduced. Hence, a high-quality solar cell without warpage and with excellent battery cell characteristics can be produced at low cost.

Furthermore, with the method of manufacturing the solar cell according to the second embodiment, when the aluminum back electrodes 5 are formed by screen printing by use of the paste mainly containing aluminum, glass and the like, no alignment with the contact holes 4a is required, unlike the first embodiment. Thus, the processing steps can be further reduced, and a solar cell with excellent characteristics can be efficiently produced.

Moreover, with the method of manufacturing the solar cell according to the second embodiment, the aluminum back electrodes 5 are provided in the form of points evenly on the entire back surface of the p-type silicon substrate, as illustrated in FIG. 3-1. With such a structure, even when the p-type silicon substrate is thinned and the aluminum back electrodes 5 are thinned, warpage is prevented from occurring in the solar cell, and excellent battery cell characteristics can be attained because of the effects of the back-surface passivation film 4 and the BSF layer 8. Hence, a high-quality solar cell can be manufactured at low cost.

In addition, when manufacturing a solar battery module, the collective back electrode 6 formed by use of a paste containing silver, glass and the like is connected in series to the light receiving surface of an adjacent solar cell, and therefore an area for soldering the lead frame is required. With the method of manufacturing the solar cell according to the second embodiment, no aluminum back electrode 5 is arranged in the soldering area 11 of the collective back electrode 6 (two wide middle portions in FIG. 3-2) in which the lead frame is to be soldered. With such a structure, soldering of the lead frame is prevented from being hindered by the alloy of aluminum and silver formed by the firing, and thus an excellent soldering state can be ensured for the lead frame.

INDUSTRIAL APPLICABILITY

As discussed above, the method of manufacturing a solar cell according to the present invention is useful for a thinned silicon substrate provided as a measure against a shortage of the material of silicon that is used as a solar cell substrate.

What is claimed is:
1. A solar cell manufacturing method, comprising:
a first step of forming an impurity diffusion layer, in which impurity elements of a second conductivity type are diffused, on one surface side of a semiconductor substrate of a first conductivity type;
a second step of forming an antireflective film on the impurity diffusion layer;
a third step of applying a first electrode material containing glass onto the antireflective film;
a fourth step of forming a passivation film on an other surface side of the semiconductor substrate;
a fifth step of forming, in at least part of the passivation film, a plurality of openings that reach the other surface side of the semiconductor substrate;

a sixth step of applying a second electrode material containing impurity elements of the first conductive type so as to fill the openings and not to be in contact with the second electrode material of adjacent openings;

a seventh step of applying a third electrode material onto the passivation film so as to be in contact with the entire second electrode material that is applied; and an eighth step for simultaneously forming, by heating the semiconductor substrate at a predetermined temperature after applying the first electrode material and the third electrode material, first electrodes that penetrate the antireflective film and are electrically connected to the impurity diffusion layer, a high-concentration region in the other surface side of the semiconductor substrate in which impurities of the first conductive type are diffused in higher concentration than in another region of the semiconductor substrate, and second electrodes and a third electrode that are electrically connected to the high-concentration region.

2. The solar cell manufacturing method according to claim 1, wherein the second electrodes are formed in a dot pattern having predetermined intervals.

3. The solar cell manufacturing method according to claim 2, wherein the second electrodes are not arranged in a soldering area of the third electrode in which an external component is to be soldered.

4. A solar cell manufacturing method, comprising:

a first step of forming an impurity diffusion layer in which impurity atoms of a second conductivity type are diffused in one surface of a semiconductor substrate of a first conductivity type;

a second step of forming an antireflective film on the impurity diffusion layer;

a third step of applying a first electrode material including glass onto the antireflective film;

a fourth step of forming a passivation film on the other surface of the semiconductor substrate;

a fifth step of selectively applying a second electrode material containing impurity elements of the first conductive type and glass onto at least part of the passivation film;

a sixth step of applying a third electrode material onto the passivation film so as to be in contact with the entire second electrode material that is applied; and a seventh step of simultaneously forming first electrodes that penetrate the antireflective film and are electrically connected to the impurity diffusion layer, a high-concentration region in which impurities of the first conductive type are diffused into the other surface of the semiconductor substrate in higher concentration than in other area of the semiconductor substrate, and second electrodes and a third electrode that are electrically connected to the high-concentration region, by heating the semiconductor substrate at a predetermined temperature after applying the first electrode material and the third electrode material.

5. The solar cell manufacturing method according to claim 4, wherein the second electrodes are formed in a dot pattern having predetermined intervals.

6. The solar cell manufacturing method according to claim 5, wherein the second electrodes are not arranged in a soldering area of the third electrode in which an external component is to be soldered.

\* \* \* \* \*